United States Patent

Bidell et al.

[15] 3,676,794

[45] July 11, 1972

[54] FREQUENCY SYNTHESIZER APPARATUS HAVING AUTOMATIC FINE TUNING

[72] Inventors: Frederick W. Bidell, Grand Island; Richard J. Hughes, Williamsville, both of N.Y.

[73] Assignee: GTE Sylvania Incorporated

[22] Filed: Aug. 30, 1971

[21] Appl. No.: 175,840

[52] U.S. Cl. ..................................331/11, 331/1 A, 331/19

[51] Int. Cl. ..........................................................H03b 3/04

[58] Field of Search......................................331/11, 19, 1 A

[56] References Cited

UNITED STATES PATENTS 3,293,559 12/1966 Howard et al. ..........................331/19

*Primary Examiner*—John Kominski

*Attorney*—Norman J. O'Malley

[57] ABSTRACT

Harmonic generator type of frequency synthesizer employing a reference frequency signal equal to the spacing between adjacent channels, a displaced reference frequency signal which differs from the reference frequency by a few hertz, and a differential frequency signal equal to the difference between the reference frequency and the displaced reference frequency. The reference frequency signal is applied to a first harmonic generator which generates a spectrum of harmonics of the reference frequency. The spectrum is applied to a phase-locked loop which produces an output frequency signal equal to a particular one of the harmonics of the reference frequency. The displaced reference frequency signal is applied to a second harmonic generator which generates a spectrum of harmonics of the displaced reference frequency. This spectrum is combined with the output signal of the phase-locked loop in a mixer and the output of the mixer is applied to a low-pass filter. The frequency of the only output signal from the filter is equal to the same particular harmonic to which the phase-locked loop is locked times the difference in frequency between the reference frequency and the displaced reference frequency.

12 Claims, 3 Drawing Figures

FREQUENCY SYNTHESIZER APPARATUS HAVING AUTOMATIC FINE TUNING

In one embodiment of the invention, the output frequency of the filter is divided in a divider by a preset value equal to the value of the predetermined harmonic of the reference frequency to which it is desired to tune the phase-locked loop. The output signal from the divider is compared with the differential frequency signal in a comparator. The frequencies of the signals are equal when the particular harmonic of the reference frequency at which the phase-locked loop is operating is the same as the intended value of the harmonic as preset in the divider. If the frequencies are different, the comparator generates a voltage signal which is coupled to the phase-locked loop to change the tuning of the phase-locked loop toward the intended harmonic of the reference frequency.

In another embodiment, the pulses of the output frequency from the filter are applied to a counter for a period of time equal to the period between pulses of the differential frequency signal, the differential frequency being equal to the difference between the reference frequency and the displaced reference frequency. The pulses are counted downward from a preset count equal to the value of the predetermined harmonic to which it is desired to tune the phase-locked loop. If the count in the counter at the end of the period is other than zero, an appropriate ramp voltage is applied to the phase-locked loop by a ramp generator. The ramp voltage causes the phase-locked loop to unlock and re-lock at successive harmonics toward the intended harmonic. Each re-locking produces a pulse which is counted by the counter counting in the appropriate direction. When the count reaches zero, the phase-locked loop has changed the proper number of harmonics and is operating at the intended harmonic, and the ramp generator is disabled.

BACKGROUND OF THE INVENTION

This invention relates to frequency synthesizer apparatus. More particularly, it is concerned with harmonic generator types of frequency synthesizers and with arrangements for insuring their operation at the frequency desired.

In known harmonic generator types of frequency synthesizers, the output of a frequency source is divided to obtain a reference frequency equal to the spacing desired between adjacent channels. The reference frequency from the divider is applied to a harmonic generator which generates a spectrum containing a plurality of harmonics, or multiples, of the reference frequency. The output of the harmonic generator is applied to a phase-detector of a phase-locked loop which includes a voltage controlled oscillator and operates in a known manner to produce an output frequency which is equal to one of the harmonics of the reference frequency.

Although known systems of this type are capable of synthesizing a wide range of frequencies, it is difficult to determine the specific channel, or harmonic of the reference frequency, to which the phase-locked loop is tuned. One technique employs programmable digital frequency dividers to divide the output frequency of the phase-locked loop by a number which will produce the reference frequency if the phase-locked loop is locked to the proper channel. The resulting frequency is compared to the reference frequency and the phase-locked loop is retuned if there is a difference. Considerable DC primary power is required in this technique to operate high speed frequency dividers.

Another conventional approach is to tune the phase-locked loop by starting from a known frequency and sweeping through channels while counting the channels swept through until the desired harmonic number is reached. However, a miscount or a transient disturbance which causes the phase-locked loop to unlock and re-lock on a different channel can occur without providing an indication, thereby causing the system inadvertantly to be tuned to an incorrect channel.

An improved frequency synthesizer including an arrangement for permitting precise identification and positive verification of the channel, or the harmonic of the reference frequency, to which the phase-locked loop is tuned is disclosed and claimed in application Serial No. (D-6523) filed concurrently herewith by Gilbert L. Boelke entitled "Frequency Synthesizer Apparatus" and assigned to the assignee of the present application. The application of Boelke discloses and claims certain embodiments in which the phase-locked loop is automatically fine tuned to acquire and remain locked at the desired channel.

SUMMARY OF THE INVENTION

Frequency synthesizer apparatus in accordance with the present invention includes an arrangement for automatically providing fine tuning of the phase-locked loop to the intended operating channel which differs from the arrangement as disclosed and claimed in the aforementioned application of Boelke.

The apparatus in accordance with the present invention includes means for producing a reference frequency signal which is equal to the desired spacing between channels. The apparatus also includes means for producing a displaced reference frequency signal which differs from the reference frequency signal by a predetermined differential frequency and means for producing a differential frequency signal which is equal to the predetermined differential frequency.

The reference frequency signal is applied to a first harmonic generating means which produces a plurality of harmonics of the reference frequency signal. The displaced reference frequency signal is applied to a second harmonic generating means which produces a plurality of harmonics of the displaced reference frequency signal.

The apparatus includes a phase-locked loop having a voltage controlled oscillator and a phase detector with a first input coupled to the first harmonic generating means, a second input coupled to the output of the voltage controlled oscillator, and an output coupled to the input of the voltage controlled oscillator. The phase-locked loop operates in a known manner to lock the output of the voltage controlled oscillator to a harmonic of the reference frequency signal. A tuning means is coupled to the input of the voltage controlled oscillator for selectively tuning the voltage controlled oscillator so as to produce an output signal of a particular harmonic of the reference frequency signal.

The output of the voltage controlled oscillator and of the second harmonic generating means are applied to a frequency mixing means which mixes the plurality of harmonics of the displaced frequency signal with the particular harmonic of the reference frequency signal. The output of the frequency mixing means is coupled to a filtering means which removes the high frequency components of frequency mixing and passes the particular harmonic of the differential frequency.

The output of the filtering means and the output of the means for producing the differential frequency signal are both coupled to an adjustment means. The output of the adjustment means is coupled to the output of the voltage controlled oscillator. The adjustment means operates to change the tuning of the voltage controlled oscillator so as to produce an output signal of another harmonic of the reference frequency signal when the particular harmonic of the differential frequency from the filtering means differs from the differential frequency signal by a multiple of other than a predetermined harmonic value. The predetermined harmonic is the harmonic of the reference frequency to which it is intended to tune the phase-locked loop. Changing of the tuning of the voltage controlled oscillator by the adjustment means overcomes the locked loop condition and causes the phase-locked loop to become re-locked operating at the predetermined harmonic of the reference frequency.

BRIEF DESCRIPTION OF THE DRAWINGS

Additional objects, features, and advantages of frequency synthesizer apparatus in accordance with the invention will be apparent from the following detailed discussion together with the accompanying drawings wherein.

DETAILED DESCRIPTION OF THE INVENTION

Figure 1:
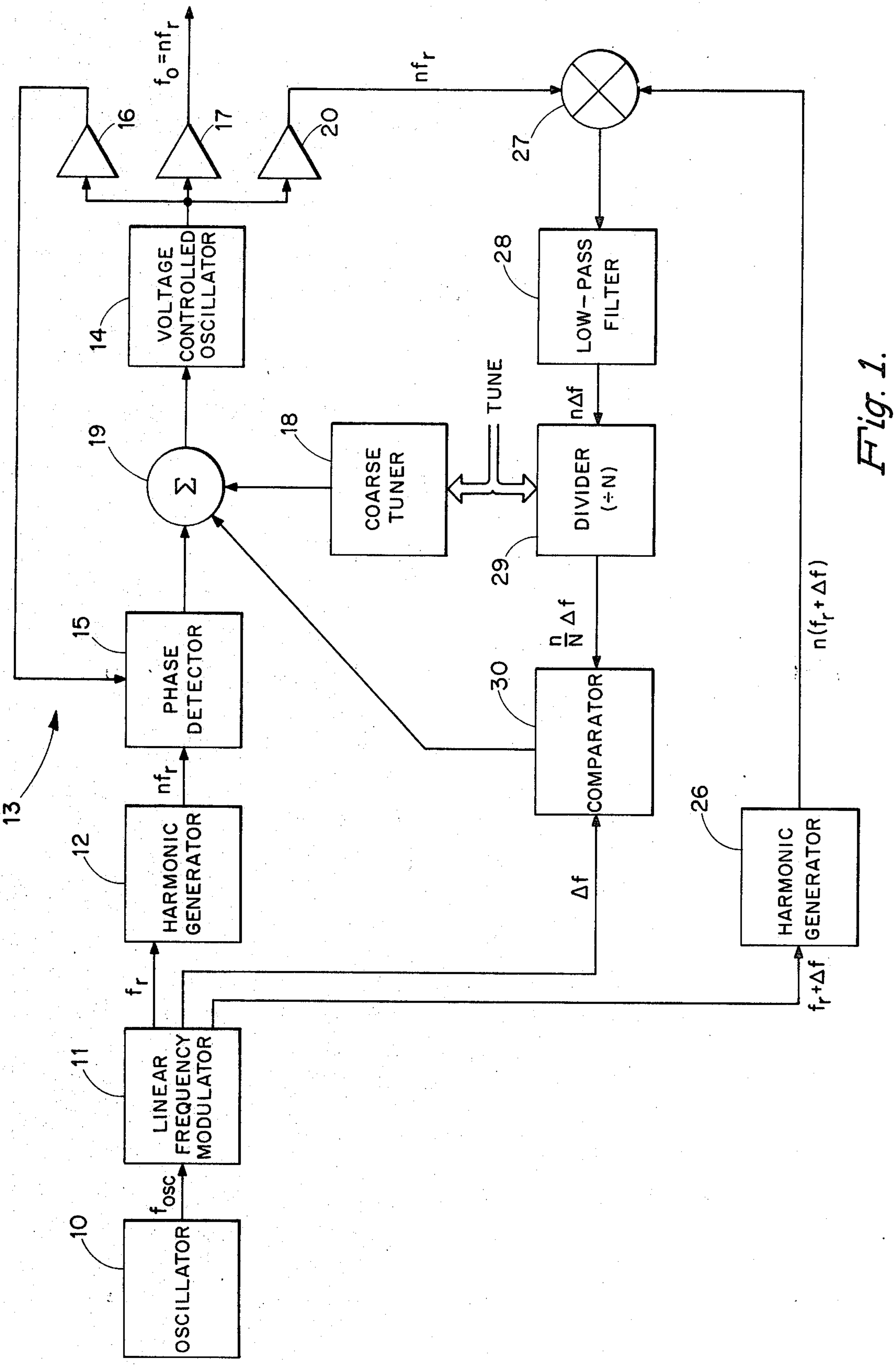
FIG. 1 is a schematic block diagram of a frequency synthesizer in accordance with the present invention.

The frequency synthesizer in accordance with the invention as illustrated in FIG. 1 includes a master oscillator 10 which may be a highly stable temperature compensated crystal oscillator. The output signal $f_{osc}$ of the oscillator 10 is coupled to a linear frequency modulator 11 having three output connections. The linear frequency modulator 11, which operates in a manner to be explained hereinbelow produces at its respective output connections a reference frequency signal $f_r$ equal to the frequency spacing desired between adjacent channels of the system, a displaced reference frequency signal $f_r + \Delta f$ which differs from the reference frequency $f_r$ by a predetermined fixed differential frequency $\Delta f$, and a differential frequency signal $\Delta f$ equal to the fixed difference between the reference frequency signal and the displaced reference frequency signal.

The reference frequency signal $f_r$ is applied to a first harmonic generator 12 which generates a spectrum of output signals which are multiples or harmonics of the input frequency $f_r$. The spectrum of harmonics is applied to a phase-locked loop 13 of generally known type. The phase-locked loop 13 includes a voltage controlled oscillator 14 which produces an output frequency signal related to its input voltage. The phase-locked loop also includes a phase detector 15 having a first input connected to the output of the harmonic generator 12 and a second input connected to the output of the voltage controlled oscillator 14 through an isolation amplifier 16. The phase-locked loop 13 may be coarse tuned by tuning a coarse tuner 18 which applies a voltage to the input of the voltage controlled oscillator through a summing network 19. The summing network may, for example, be a single set of resistors connected to a common output node.

The phase-locked loop 13 operates in the conventional manner. The output of the phase detector 15 is an appropriate filtered and amplified error voltage which is related to the phase and frequency difference between its input signals. When the voltage applied at the input of the voltage controlled oscillator 14 by the coarse tuner 18 causes its output frequency $f_o$ to be sufficiently close to a harmonic of the reference frequency, the error voltage from the phase detector 15 automatically adjusts so as to lock the voltage controlled oscillator 14 to operation at that frequency. In FIG. 1 the particular harmonic of the reference frequency at which the phase-locked loop is operating is designated $nf_r$. The output frequency $f_o$ (which equals $nf_r$) of the phase-locked loop 13 is taken from the output of the voltage controlled oscillator 14 through an isolation amplifier 17.

The linear frequency modulator 11 produces a displaced reference frequency $f_r + \Delta f$ which differs from the reference frequency $f_r$ by a fixed differential frequency $\Delta f$. The differential frequency $\Delta f$ is preferably very small, of the order of a few hertz. The displaced reference frequency signal $f_r + \Delta f$ is applied to a second harmonic generator 26. The spectrum of harmonics generated by the second harmonic generator 26 includes the particular harmonic of the displaced frequency $n(f_r + \Delta f)$ which is the same harmonic of the reference frequency $nf_r$ to which the phase-locked loop 13 is tuned.

The output signals from the second harmonic generator 26, including the particular harmonic of the displaced frequency $n(f_r + \Delta f)$, are applied to the first input of a mixer 27, and the output signal $nf_r$ from the phase-locked loop 13 is applied to the second input of the mixer 27 by way of an isolation amplifier 20. The output of the mixer 27 includes among its components the particular harmonic of the differential frequency $n\Delta f$. The output of the mixer is applied to a low pass filter 28 which removes high frequency components and passes low frequency components. Specifically, the cutoff frequency of the filter 28 is such that it only passes harmonics of the differential frequency within the range of harmonics used in the system. Thus, the particular harmonic of the differential frequency $n\Delta f$ is the only signal present at the output of the filter.

The output signal $n\Delta f$ from the low-pass filter 28 is applied to a divider 29 which divides the incoming frequency by a preset value N. The preset value of N is equal to the desired harmonic of the reference frequency $f_r$ which the system is to produce at the output of the voltage controlled oscillator 14. The divider 29 and coarse tuner 18 may be tuned simultaneously.

The output of the divider 29, $(n)/(N)\Delta f$, is applied to one input of a comparator 30. The differential frequency signal $\Delta f$ from the linear frequency modulator 11 is applied to a input of the comparator 30. The comparator 30 compares the two incoming signals and produces an appropriate output signal to the summing network 19. If the phase-locked loop 13 is operating at the same harmonic of the reference frequency as the desired harmonic value as set in the divider (that is, $n=N$), the output frequency of the divider 29 equals the differential frequency and the comparator output does not change the voltage level being applied at the input to the voltage controlled oscillator 14 by the summing network 19. If the input frequencies to the comparator 30 are not the same (indicating that $n$ is not equal to $N$), the comparator 30 generates an appropriate voltage signal which is applied to the summing network 19 changing the input voltage to the voltage controlled oscillator 14 and causing the phase-locked loop to unlock and relock at the next adjacent harmonic of the reference frequency in the proper direction toward the intended harmonic $N$.

The comparator 30 may, for example, be a sample and hold circuit in which the differential frequency signal $\Delta f$ from the linear frequency modulator 11 is used to generate a linear ramp of positive slope by charging a capacitor rapidly and allowing the voltage to decay through a constant current diode. The output $(n)/(N)\Delta f$ of the divider 29 triggers a narrow sample pulse which closes a transistor gate causing the instantaneous voltage of the ramp to be stored in a capacitor. The resulting signal in the capacitor is amplified and applied to the summing network 19 by way of a D.C. blocking capacitor. Thus, when the two inputs of the comparator 30 are of the same frequency ($n=N$), the comparator output is a constant D.C. voltage. If the output from the divider 29 is of higher frequency ($n>N$), the ramp voltage is sampled earlier at each sampling. Thus, a negative-going output signal is applied to the summing network 19 lowering the input voltage to the voltage controlled oscillator 14 and causing it to unlock and relock at the next lower harmonic. If the output frequency of the divider 29 is lower ($n<N$), the output voltage of the comparator 30 increases causing the voltage controlled oscillator 14 to be shifted to the next higher harmonic.

Figure 2:
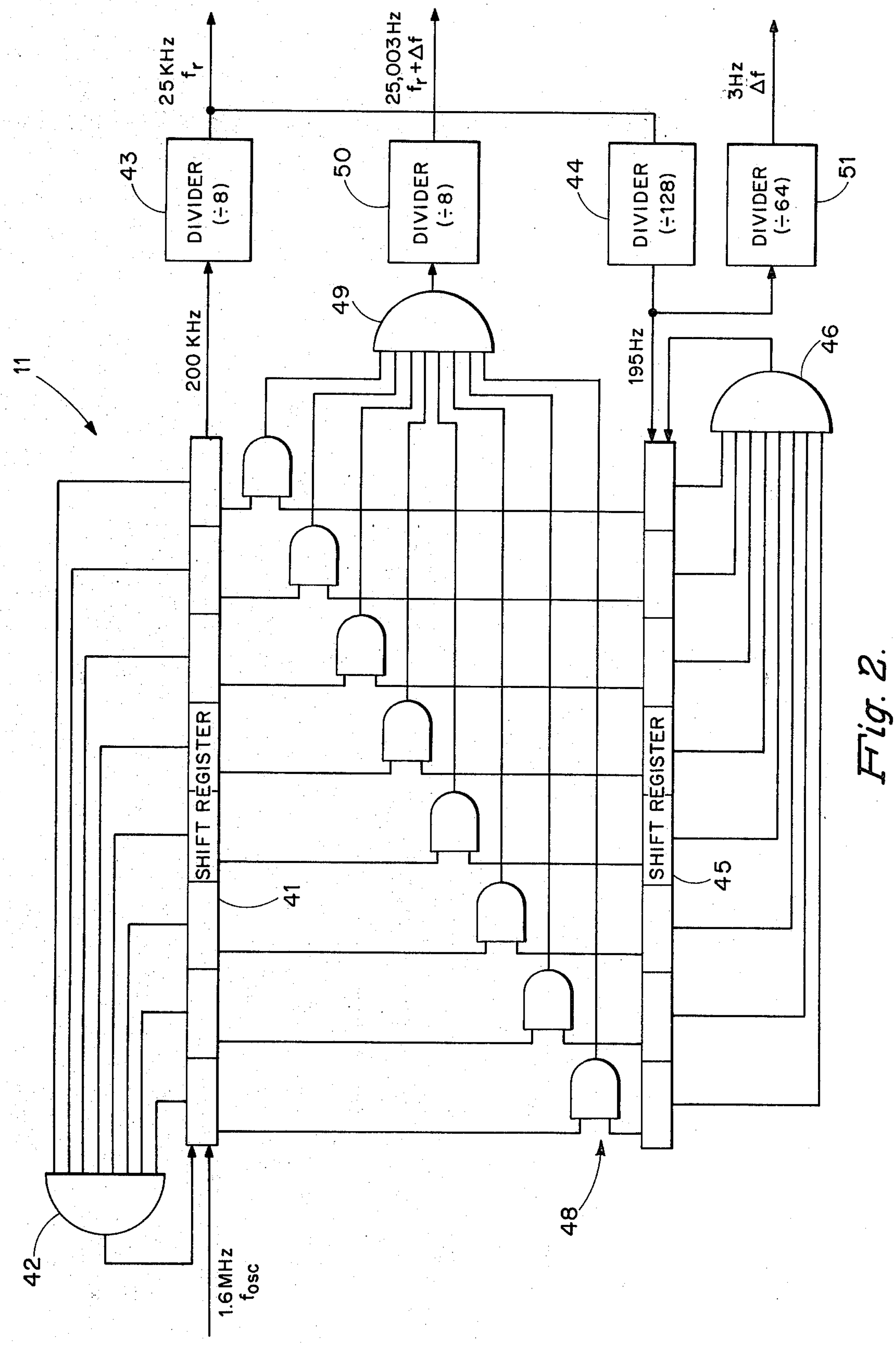
FIG. 2 is a schematic block diagram of an arrangement employed in the apparatus of FIG. 1 to obtain the reference frequency signal, the displaced reference frequency signal, and the differential frequency signal.

The reference frequency signal $f_r$, the displaced reference frequency signal $f_r + \Delta f$, and the differential frequency signal $\Delta f$ may be produced by any of various well known techniques. An example of a linear frequency modulator 11 which may be employed to produce these signals is illustrated in detail in the block diagram of FIG. 2. The linear frequency modulator 11 of FIG. 2 is arranged to receive a signal from the oscillator $f_{osc}$ of 1.6 megahertz and to produce a reference frequency signal $f_r$ of 25 kilohertz, a displaced reference frequency signal $f_r + \Delta f$ of 25,003 hertz, and a differential frequency signal $\Delta f$ of 3 hertz.

The incoming signal $f_{osc}$ of the oscillator is applied to an eight-stage shift register 41 which has the stages connected through an OR gate 42 to an inhibit connection so as to provide a ring counter with one bit circulating. One output pulse is produced for every eight input pulses, thus, the output of the shift register 41 is a 200-kilohertz signal. This signal is applied to a divider 43 which divides by 8 to provide the reference frequency signal $f_r$ of 25 kilohertz. The 25-kilohertz signal is also applied to a divider arrangement 44 which divides by 128 to produce an output of approximately 195 hertz. The 195-hertz signal is applied to a second eight-stage shift register 45 having the stages connected through an OR gate 46 to an inhibit connection so as to provide a second ring counter with one bit circulating.

An arrangement of eight two-input AND gates 48 are connected with their inputs to opposite stages of the two shift registers 42 and 45 and their outputs to an OR gate 49. The stages of the second shift register 45 enable the gates 48 in sequence causing a phase shift in the signal as received from the shift register 41. This change in phase represents a frequency shift equal to the input frequency to the second shift register 45 divided by the number of stages in the register. The result is a frequency shift of slightly over 24 hertz, or an output frequency from the OR gate 49 of approximately 200,024 hertz. The output of the OR gate 49 is applied to a divider 50 which divides by 8 to produce an output signal of approximately 25,003 hertz. This signal is employed as the displaced reference frequency signal $f_r + \Delta f$.

The 195-hertz signal from the divider arrangement 44 is also applied to a divider arrangement 51 which divides by 64 to produce an output frequency of approximately 3 hertz. This signal is the frequency difference between the outputs of the dividers 43 and 50, and is employed as the differential frequency signal $\Delta f$.

Figure 3:
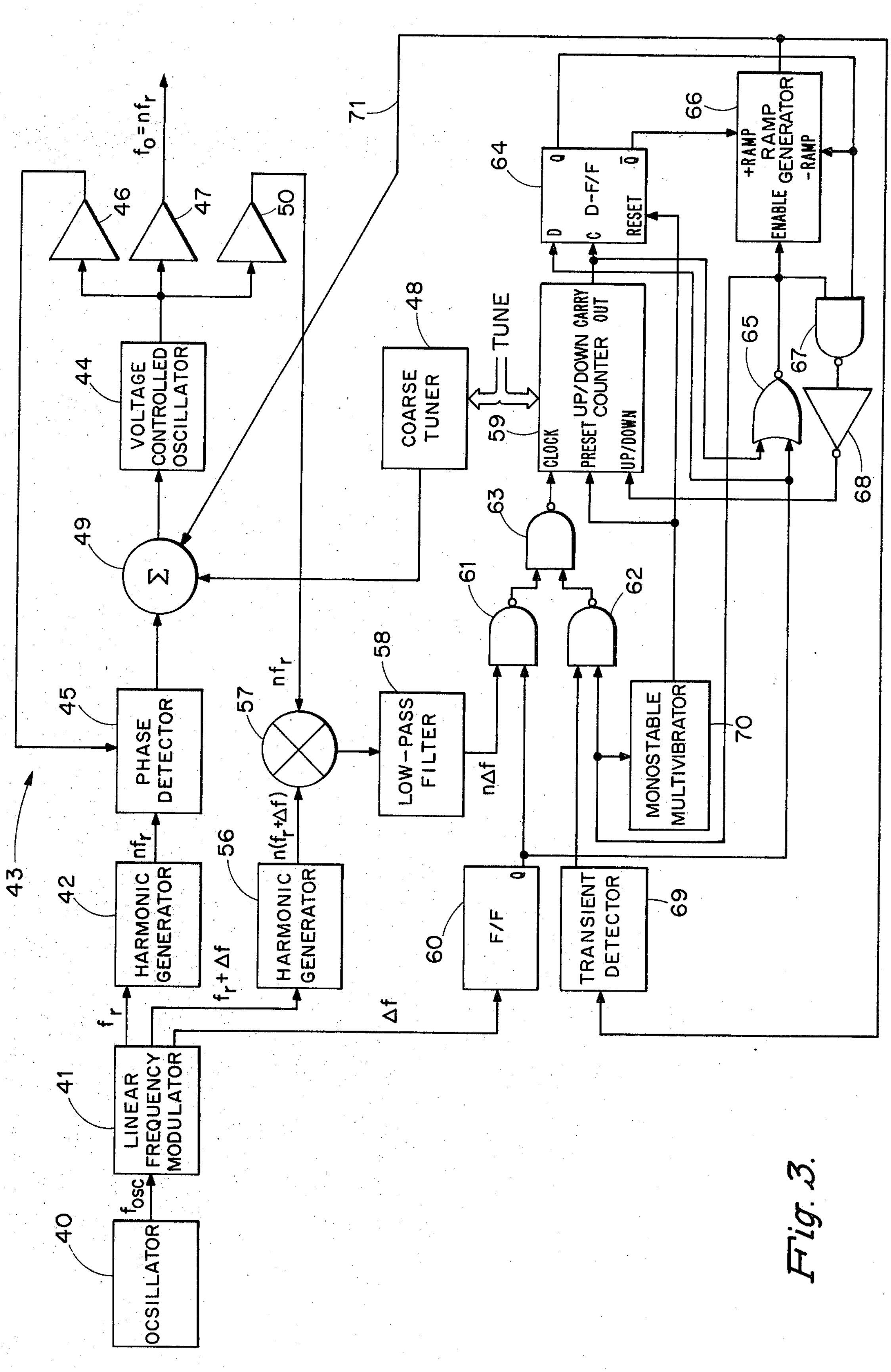
FIG. 3 is a schematic block diagram of another embodiment of a frequency synthesizer in accordance with the invention.

FIG. 3 illustrates another embodiment of the invention in which the number of pulses of the particular harmonic of the differential frequency signal $n\Delta f$ occurring during one period of the differential frequency $\Delta f$ are counted and compared with a preset value $N$ equal to the desired harmonic, and the difference is employed to change the harmonic at which the phase-locked loop is operating to the preset value $N$ during the next period of the differential frequency $\Delta f$. The apparatus includes a master oscillator 40, a linear frequency modulator 41, a first harmonic generator 42, and a phase-locked loop 43 having a phase detector 45 and a voltage controlled oscillator 44. The apparatus also includes isolation amplifiers 46, 47, and 50 and a coarse tuner 48, a summing network 49, a second harmonic generator 56, a mixer 57, and a low-pass filter 58. These elements correspond to similar elements in the embodiment illustrated in FIG. 1 and operate in the manner as previously described.

The apparatus includes an up/down counter 59 which is set to an initial count of $N$, the value of the desired harmonic of the reference frequency at which the frequency synthesizer is intended to be operated. The count of $N$ is loaded into the up/down counter 59 by a pulse at its preset terminal. The up/down counter 59 counts pulses applied at its clock terminal in either an upward or downward direction depending upon the signal condition present at the up/down terminal. In terms of positive logic, a high level signal causes the counter to count upward and a low level signal causes the counter to count downward. The up/down counter 59 produces a high level at its output terminal when the count in the up/down counter is zero.

The pulses of the particular harmonic of the differential frequency $n\Delta f$ from the low-pass filter 58 are applied to the clock terminal of the up/down counter 59 through a gating arrangement of NAND gates 61, 62, and 63. The pulses, or cycles, of the particular harmonic of the differential frequency $n\Delta f$ are gated to the clock terminal of the up/down counter 59 under the control of a flip-flop 60. The flip-flop 60 is triggered by the differential frequency signal $\Delta f$ so that it alternates between its Q and Q states during successive periods of the differential frequency $\Delta f$. The Q output terminal of the flip-flop 60 is applied to the NAND gate 61. While the flip-flop 60 is in the Q state producing a high level Q output signal to the NAND gate 61, each cycle of the particular harmonic of the differential frequency $n\Delta f$ passes through NAND gates 61 and 63 to the clock terminal of the up/down counter 59 to be counted.

The Q output signal from the flip-flop 60 is also applied to a NOR gate 65 producing a low level signal at one input to the NAND gate 62, thus preventing the NAND gate 62 from affecting the input to the up/down counter. In addition, the low level signal from the NOR gate 65 is applied to the NAND gate 67 causing the output of the NAND gate 67 to be high. This high level signal is inverted by the inverter 68 and a low level signal is applied to the up/down terminal of the up/down counter 59 causing the up/down counter 59 to count downward on the pulses presented at the clock terminal. Thus, during a period of the differential frequency $\Delta f$ during which the Q output signal from the flip-flop 60 enables the NAND gate 61, the cycles of the particular harmonic of the differential frequency $n\Delta f$ from the low-pass filter 58 are counted downward from the initial count $N$ preset in the counter. The next pulse to the input of the flip-flop 60, occurring at the end of the counting period of the differential frequency $\Delta f$, sets the flip-flop in the Q state terminating the Q output. Thus, the NAND gate 61 is no longer enabled and pulses from the low-pass filter 58 are no longer counted by the counter. In addition, as will be explained in greater detail hereinbelow, the output of the NOR gate 65 and consequently of the inverter 68 are no longer controlled by the state of the flip-flop 60.

The apparatus also includes a D type flip-flop 64 having its clock input terminal connected to the output terminal of the up/down counter 59. Its D input terminal is connected to the Q output of the flip-flop 60. The D type flip-flop 64 is ordinarily in its reset Q state producing a high level Q output signal and not producing a high level Q output signal. The D type flip-flop 64 is switched to the Q state by an output signal from the up/down counter 59 while the D input is enabled by the presence of a Q output signal from the flip-flop 60.

The apparatus also includes a ramp generator 66 which is enabled to produce either a + ramp signal (positive-going) or a − ramp signal (negative-going) by the presence of a high level signal at its enable terminal from the NOR gate 65. When enabled by a signal at the enable terminal, the ramp generator 66 produces a + ramp voltage at its output terminal when the D type flip-flop 64 is in the Q state and produces a − ramp voltage at its output terminal when the D type flip-flop 64 is in the Q state. The output of the ramp generator 66 is applied to the summing network 49 of the phase-locked loop 43 by way of control line 71. A + ramp signal applied to the summing network 49 causes the phase-locked loop to unlock from its operating frequency at the particular harmonic of the reference frequency $nf_r$ and continually re-lock at successively higher harmonic values of the reference frequency as long as the positive-going + ramp signal continues to be applied. Conversely, a − ramp signal at the output of the ramp generator 66 causes the phase-locked loop to continually unlock and re-lock at successively lower harmonic values of the reference frequency. Whenever the ramp generator output signal is terminated, the phase-locked loop 43 operates to remain locked at the last acquired harmonic of the reference frequency.

The control line 71 to the summing network 49 is also connected to the input of a transient detector 69. Each time the phase-locked loop locks into operation at a new harmonic of the reference frequency, a transient pulse occurs on the control line 71. The transient detector 69 detects each transient pulse and in response thereto applies a pulse to the NAND gate 62.

If in counting the cycles of the particular harmonic of the differential frequency $n\Delta f$ from the low-pass filter 58 downward from the value $N$ set in the up/down counter 59 the counter does not reach a count of zero before the end of the counting period of the differential frequency $\Delta f$ when the level at the Q output of the flip-flop 60 goes low, the counter does not produce a high level output signal. Thus, the D type flip-flop 64 continues to produce the Q output signal. The low level at the Q output causes the NAND gate 67 to continue to produce a high level signal which is inverted by the inverter 68 causing the up/down counter 59 to remain enabled to count downward. In addition, with the Q output of flip-flop 60 and the output of the up/down counter 59 both low, the output of the NOR gate 65 is high. This high level condition enables the ramp generator 66 and also enables the NAND gate 62 so that pulses from the transient detector 69 pass through NAND gates 62 and 63 to the clock input of the counter 59.

If while the up/down counter 59 is counting the cycles of the particular differential frequency $n\Delta f$ from the low-pass filter 58 the count counts downward through zero, the counter produces an output pulse. Since during this counting period a Q output signal is being produced by the flip-flop 60 and applied to the D terminal of the D type flip-flop 64, the D type flip-flop 64 is switched to the Q state producing a Q output signal and terminating the Q signal. When flip-flop 60 switches to its Q state at the end of the counting period of the differential frequency $\Delta f$, a high level output signal is produced by the NOR gate 65. This signal together with the Q output signal from the D type flip-flop 64 causes the output of the NAND gate 67 to become low. The output of NAND gate 67 is inverted by the inverter 68 producing a high level signal at the up/down terminal of the up/down counter 59 conditioning the counter to count upward. In addition, the high level output of the NOR gate 65 enables the ramp generator 66 and also enables NAND gate 62 permitting pulses from the transient detector 69 to be counted by the counter 59.

A monostable multivibrator 70 has its input connected to the output of the NOR gate 65. The monostable multivibrator is triggered by the output signal from the NOR gate 65 when the flip-flop 60 switches from the Q to the Q state, and produces an output pulse at its output terminal near the end of the next period of the differential frequency $\Delta f$. This pulse is applied to the preset terminal of the up/down counter 59 causing the set value $N$ to be loaded into the counter as an initial count for the next counting down procedure. In addition, the D type flip-flop 64 is reset to the Q state.

The apparatus of FIG. 3 as described operates in the following manner to change the operating frequency of the frequency synthesizer from the particular harmonic of the reference frequency $nf_r$ at which it is operating to the intended frequency $Nf_r$ within two periods of the differential frequency $\Delta f$. As explained previously, during the counting period of the differential frequency $\Delta f$ when the flip-flop 60 is in the Q state, NAND gate 61 is enabled and NAND gate 62 is disabled. Pulses of the particular harmonic of the differential frequency $n\Delta f$ from the low-pass filter 58 pass to the clock terminal of the up/down counter 59. The up/down counter 59 is preset to an initial value of the desired operating harmonic $N$.

If the particular harmonic of operation $n$ is the same as the desired preset value $N$, the up/down counter 59 counts downward to a count of zero, which remains after the flip-flop 60 changes to the Q state. The up/down counter 59 produces a high level output signal causing the output of the NOR gate 65 to remain low. This signal holds the ramp generator 66 disabled, and thus, no change is made in the operating frequency of the phase-locked loop 43.

If the phase-locked loop is operating at a frequency $nf_r$ which is lower than the intended frequency $Nf_r$ ($n<N$), at the end of the counting period of the differential frequency $\Delta f$ there is a count remaining in the counter 59. The remaining count is the number of harmonics of the reference frequency the phase-locked loop must be shifted upward in order to operate at the desired harmonic frequency. The D type flip-flop 64 remains in the Q state conditioning the ramp generator 66 to produce a + ramp. In addition, a low level signal continues to be applied to the up/down terminal of the up/down counter 59 so that the up/down counter will continue to count downward. Thus, at the end of the counting period of the differential frequency $\Delta f$, when the flip-flop 60 switches to the Q state, the resulting high level output of the NOR gate 65 enables the ramp generator 66 and the positive-going + ramp is applied to the summing network 49 of the phase-locked loop 43. As the continuously increasing voltage is applied to the summing network, the phase-locked loop unlocks and re-locks at successively higher harmonics of the reference frequency. Each time the phase-locked loop locks at a harmonic, a transient pulse is produced and detected by the transient detector 69. Each pulse from the transient detector passes through the NAND gates 62 and 63 to the clock terminal of the up/down counter 59 causing the up/down counter to continue counting downward. The counter 59 receives a pulse for each change in the operating harmonic of the phase-locked loop so that when the phase-locked loop shifts to the desired harmonic value $N$, the count in the up/down counter 59 reaches zero. The resulting output signal from the counter removes the enabling signal from the ramp generator 66 causing the phase-locked loop 43 to remain operating at the harmonic to which it has been shifted. Near the end of this adjusting period of the differential frequency $\Delta f$ the monostable multivibrator 70 produces a pulse which presets the up/down counter to the initial value of $N$.

If the harmonic of the reference frequency $nf_r$ at which the phase-locked loop 43 is operating is higher than the desired frequency $Nf_r$ ($n>N$), in counting the cycles from the low-pass filter 58 during the counting period the up/down counter 59 will pass through zero and continue to count downward. When the up/down counter 59 is at zero, its output signal causes the D type flip-flop 64 to switch from the Q state to the Q state. At the end of the counting period the amount the counter has counted beyond zero is the number of harmonics of the reference frequency the phase-locked loop must be shifted downward in order to operate at the desired harmonic frequency. During the adjusting period the Q output signal from the D type flip-flop 64 conditions the ramp generator 66 to produce the − ramp voltage and conditions the up/down counter 59 to count upward. As the negative-going − ramp voltage is applied to the summing network 49 of the phase-locked loop 43, the phase-locked loop unlocks and re-locks at successively lower harmonics of the reference frequency. Each time the phase-locked loop locks at a harmonic, a pulse is produced by the transient detector 69 and is counted upward by the up/down counter 59. When the phase-locked loop has shifted a sufficient number of times to be operating at the desired harmonic $N$, the counter has counted an equivalent number of pulses and reaches zero. The resulting output signal from the counter removes the enabling signal from the ramp generator 66 causing the phase-locked loop 43 to remain operating at the harmonic to which it has been shifted. Near the end of the adjusting period of the differential frequency $\Delta f$ the monostable multivibrator 70 produces a pulse which presets the up/down counter 59 to the initial value of $N$ and also resets the D type flip-flop 64 to the Q state.

Frequency synthesizer apparatus in accordance with the invention as shown and described hereinabove employs a displaced spectrum of the harmonic of the reference frequency together with a differential frequency equal to the amount of displacement of the reference frequency to obtain precise tuning. The apparatus illustrated in FIG. 1 operates to divide the harmonic of the differential frequency obtained from filtering the results of mixing the operating harmonic of the reference frequency signal with the spectrum of harmonics of the displaced frequency signal by the intended harmonic value to which the apparatus is to be tuned. Thus, when the phase-locked loop is operating at the intended frequency, the output of the divider is equal to the differential frequency. Any difference is detected by the comparator and employed to produce an appropriate voltage to the summing network to adjust the operating frequency of the phase-locked loop until it operates at the intended harmonic of the reference frequency.

In the apparatus illustrated in FIG. 3 the number of pulses of the harmonic of the differential frequency occurring during a period of the differential frequency are counted and the count compared with a preset count equal to the intended harmonic value. The difference in counts is employed to enable an appropriate ramp voltage to be applied to the summing network to cause the phase-locked loop to unlock and re-lock at successive harmonics for a number of times equal to the difference in count. The phase-locked loop is thus tuned to the intended harmonic of the reference frequency during a single tuning operation requiring only two periods of the differential frequency.

With frequency synthesizer apparatus as shown and described accurate control of coarse tuning and precise initial acquisition are not important. The tuning arrangements operate at very low frequencies as compared to the output frequencies of the apparatus. Therefore, very low power consuming circuit elements may be employed. Frequency synthesizer apparatus in accordance with the invention as described herein advantageously may be employed in channelized communication equipment of various types in which an accurately predetermined frequency of operation on a multiplicity of channels is desired.

Thus, while there has been shown and described what are considered to be preferred embodiments of the present invention, it will be obvious to those skilled in the art that various changes and modifications may be made therein without departing from the invention as defined by the appended claims.

What is claimed is:

1. Frequency synthesizer apparatus including in combination means for producing a reference frequency signal;

means for producing a displaced reference frequency signal differing from the reference frequency signal by a predetermined differential frequency;

means for producing a differential frequency signal equal to said predetermined differential frequency;

first harmonic generating means coupled to the means for producing the reference frequency signal for producing a plurality of harmonics of the reference frequency signal;

second harmonic generating means coupled to the means for producing the displaced reference frequency signal for producing a plurality of harmonics of the displaced reference frequency signal;

a voltage controlled oscillator;

phase detector means having a first input coupled to the first harmonic generating means, a second input coupled to the output of the voltage controlled oscillator, and an output coupled to the input of the voltage controlled oscillator to provide a phase-locked loop, whereby the frequency of the output signal of the voltage controlled oscillator is equal to a harmonic of the reference frequency signal;

tuning means coupled to the input of the voltage controlled oscillator for selectively tuning the voltage controlled oscillator to produce an output signal of a particular harmonic of the reference frequency signal;

frequency mixing means coupled to the second harmonic generating means and to the output of the voltage controlled oscillator for frequency mixing the plurality of harmonics of the displaced reference frequency signal with the particular harmonic of the reference frequency signal;

filtering means coupled to the output of the frequency mixing means for removing the high frequency components of frequency mixing and passing the particular harmonic of the differential frequency; and adjustment means coupled to the filtering means, the means for producing the differential frequency signal, and the input of the voltage controlled oscillator, said adjustment means being operable to change the tuning of the voltage controlled oscillator to produce an output signal of another harmonic of the reference frequency signal when the particular harmonic of the differential frequency from the filtering means differs from the differential frequency signal by a multiple of other than a predetermined harmonic value.

2. Frequency synthesizer apparatus in accordance with claim 1 including oscillator means for producing an oscillator frequency signal; and frequency reducing means coupled to the oscillator means and operable to produce said reference frequency signal, said displaced reference frequency signal, and said differential frequency signal.

3. Frequency synthesizer apparatus in accordance with claim 1 wherein said adjustment means includes means for selectively setting the predetermined harmonic value;

divider means coupled to the filtering means for producing an output signal of frequency equal to the particular harmonic of the differential frequency divided by said predetermined harmonic value;

comparison means coupled to the divider means, to the means for producing the differential frequency signal, and to the input of the voltage controlled oscillator; said comparison means being operable to change the value of the harmonic of the reference frequency produced by the voltage controlled oscillator toward the predetermined harmonic value when the output signal from the divider means differs from the differential frequency signal.

4. Frequency synthesizer apparatus in accordance with claim 1 wherein said adjustment means includes dividing means coupled to the filtering means and operable to be selectively set to divide by a predetermined harmonic value, said dividing means being operable to produce an output signal of frequency equal to the particular harmonic of the differential frequency divided by said predetermined harmonic value as set therein; and comparing means coupled to said dividing means, to the means for producing the differential frequency signal, and to the input of the voltage controlled oscillator; said comparing means being operable to compare the output signal of the dividing means with the differential frequency signal and to adjust the voltage level at the input of the voltage controlled oscillator to change the harmonic of the reference frequency signal produced by the voltage controlled oscillator toward the predetermined harmonic value.

5. Frequency synthesizer apparatus in accordance with claim 4 including a voltage summing network having a first input from the phase detector, a second input from the coarse tuner, a third input from the comparing means, and an output to the voltage controlled oscillator; said voltage summing network being operable to combine the voltages received at the inputs thereto and to produce an output voltage equal to the sum of the input voltages;

and wherein said comparing means is operable to increase the voltage level at the third input to the voltage summing network when the frequency of the output signal from the dividing means is less than the differential frequency, and to decrease the voltage level at the third input to the voltage summing network when the frequency of the output signal from the dividing means is greater than the differential frequency.

6. Frequency synthesizer apparatus in accordance with claim 5 including oscillator means for producing an oscillator frequency signal; and frequency reducing means coupled to the oscillator means and operable to produce said reference frequency signal, said displaced reference frequency signal, and said differential frequency signal.

7. Frequency synthesizer apparatus in accordance with claim 1 wherein said adjustment means includes means for selectively setting a representation of the predetermined harmonic value;

means coupled to the filtering means and to the means for producing a differential frequency signal and operable to count the number of cycles of the particular harmonic of the differential frequency occurring during a preestablished number of cycles of the differential frequency; and means coupled to the input of the voltage-controlled oscillator and operable to compare the representation of the predetermined harmonic value with the count of the number of cycles of the particular harmonic of the differential frequency occurring during the pre-established number of cycles of the differential frequency, and to change the value of the harmonic of the reference frequency produced by the voltage controlled oscillator toward the predetermined harmonic value when the count differs from the count for a particular harmonic having the same value as the predetermined harmonic value.

8. Frequency synthesizer apparatus in accordance with claim 1 wherein said adjustment means includes counting means operable to count the cycles of an input signal;

means for selectively setting a count representative of the predetermined harmonic value in said counting means;

input gating means coupled to the filtering means and to the counting means;

control means coupled to said means for producing a differential frequency signal and to said input gating means and operable to enable cycles from the filtering means to be counted by the counting means for a pre-established number of cycles of the differential frequency;

said counting means being operable to produce signals representative of the magnitude and direction of the difference between the value of the predetermined harmonic as represented by the count set in the counter and the value of the particular harmonic as represented by the number of cycles of the particular harmonic of the differential frequency counted during the pre-established number of cycles of the differential frequency; and means coupled to the counting means and to the input of the voltage controlled oscillator and operable to apply a voltage related to the magnitude and direction of the difference in harmonic values as represented by the signals from the counting means to the input of the voltage controlled oscillator to change the harmonic of the reference frequency signal produced by the voltage controlled oscillator to the predetermined value.

9. Frequency synthesizer apparatus in accordance with claim 8 including tuning detection means coupled to the voltage controlled oscillator and to the counting means and operable to cause the counting means to terminate said signals therefrom when the value of the harmonic of the reference frequency produced by the voltage controlled oscillator becomes equal to the predetermined harmonic value.

10. Frequency synthesizer apparatus in accordance with claim 1 wherein said adjustment means includes counting means operable to count the cycles of an input signal and operable to produce an output signal when the count in the counting means is at zero;

means for selectively setting an initial count corresponding to the value of the predetermined harmonic in said counting means;

input gating means coupled to the filtering means and to the counting means;

control means coupled to said means for producing a differential frequency signal and to said input gating means and operable to enable the input gating means to permit cycles of the signal from the filtering means to be counted for the period of a cycle of the differential frequency, the number of cycles of the signal from the filtering means during a cycle of the differential frequency corresponding to the value of the particular harmonic of the reference frequency;

direction control means coupled to the counting means and operable to produce a first control signal when in a first condition and to produce a second control signal when in a second condition, said direction control means being normally set in the first condition and being operable to be switched to the second condition in response to an output signal from said counting means;

means coupled to the control means, to the direction control means, and to the counting means, said means being operable to cause the counting means to count downward during the period the control means is enabling the input gating means, being operable to cause the counting means to count downward when the control means is not enabling the input gating means and the direction control means is in the first condition, and being operable to cause the counting means to count upward when the control means is not enabling the input gating means and the direction control means is in the second condition;

voltage generating means coupled to the control means, to the counting means, to the direction control means, and to the input of the voltage controlled oscillator, said voltage generating means being operable when the control means is not enabling the gating means and the counting means is not producing an output signal to produce a ramp voltage in one direction in response to a first control signal applied thereto from the direction control means and to produce a ramp voltage in the opposite direction in response to a second control signal applied thereto from the direction control control means; and tuning detector means coupled to the voltage controlled oscillator and to the input gating means and operable to produce a signal for each change in the harmonic of the reference frequency caused by a ramp voltage applied to the input of the voltage controlled oscillator;

said input gating means being operable to apply a pulse to the counting means in response to each signal thereto from the tuning detector means when the control means is not enabling the input gating means;

said counting means being operable to count said pulses until a count of zero is reached and the value of the harmonic of the reference frequency produced by the voltage controlled oscillator equals the predetermined harmonic value whereby an output signal is produced thereby terminating the ramp voltage from the voltage generating means and preventing further changes in the frequency of the output signal of the voltage controlled oscillator.

11. Frequency synthesizer apparatus in accordance with claim 10 wherein said control means includes a bistable means which is switched alternately between first and second conditions during each cycle of the differential frequency signal;

said bistable means being operable when in the first condition to enable the input gating means to permit cycles of the signal from the filtering means to be counted, to prevent pulses from the tuning detector means from being counted, to cause the counting means to count downward, and to prevent operation of the voltage generating means; said bistable means being operable when in the second condition to prevent cycles of the signal from the filtering means from being counted, to permit pulses from the tuning detector means to be counted, to permit the direction of counting of the counting means to be controlled by the condition of the direction control means, and to permit the voltage generating means to produce a ramp voltage.

12. Frequency synthesizer apparatus in accordance with claim 11 wherein said direction control means includes a bistable means coupled to the counting means and to the bistable means of said control means and having a first condition corresponding to the first condition of the direction control means and a second condition corresponding to the second condition of the direction control means, said bistable means of said direction control means being switched from the first condition to the second condition in response to an output signal from the counting means while the bistable means of the control means is in the first condition.

* * * * *